United States Patent
McCollum (10) Patent No.: US 10,553,643 B2
(45) Date of Patent: Feb. 4, 2020

(54) CIRCUIT AND LAYOUT FOR RESISTIVE RANDOM-ACCESS MEMORY ARRAYS HAVING TWO BIT LINES PER COLUMN

(71) Applicant: Microsemi SoC Corp., San Jose, CA (US)

(72) Inventor: John L McCollum, Orem, UT (US)

(73) Assignee: Microsemi SoC Corp., San Jose, CA (US)

( * ) Notice: Subject to any disclaimer, the term of this patent is extended or adjusted under 35 U.S.C. 154(b) by 0 days.

(21) Appl. No.: 16/155,083

(22) Filed: Oct. 9, 2018

(65) Prior Publication Data

US 2020/0006429 A1 Jan. 2, 2020

Related U.S. Application Data

(60) Provisional application No. 62/691,566, filed on Jun. 28, 2018.

(51) Int. Cl.
*H01L 27/24* (2006.01)
*G11C 13/00* (2006.01)
(Continued)

(52) U.S. Cl.
CPC ........ *H01L 27/2436* (2013.01); *G11C 13/004* (2013.01); *G11C 13/0069* (2013.01);
(Continued)

(58) Field of Classification Search
CPC . H01L 27/2436; H01L 27/2463; H01L 45/08; H01L 45/1233; G11C 13/0011
See application file for complete search history.

(56) References Cited

U.S. PATENT DOCUMENTS 8,665,629 B2 * 3/2014 Park .................. H01L 27/228
365/148
9,472,272 B2 10/2016 Gopinath
(Continued)

FOREIGN PATENT DOCUMENTS

| EP | 2043156 A2 | 4/2009 |
| EP | 3244417 A1 | 11/2017 |
| WO | 2016133661 A1 | 8/2016 |

OTHER PUBLICATIONS

PCT/US2019/027759, International Search Report and Written Opinion, dated Jul. 18, 2019.
(Continued)

*Primary Examiner* — Allison Bernstein
(74) *Attorney, Agent, or Firm* — Glass and Associates; Kenneth D'Alessandro; Kenneth Glass (57) ABSTRACT

A layout is presented for a ReRAM memory cell array including rows and columns of ReRAM cells, each ReRAM cell is in a row and column of ReRAM cells. Each ReRAM cell includes a ReRAM device. A first transistor is coupled between the ReRAM device and a first bit line associated with the column containing the ReRAM cell. The first transistor has a gate coupled to a first word line associated with the row containing the ReRAM cell. A second transistor is coupled between the ReRAM device and a second bit line associated with the column containing the ReRAM cell. The second transistor has a gate coupled to a second word line associated with the row containing the ReRAM cell.

6 Claims, 8 Drawing Sheets

(51) Int. Cl.
*H01L 45/00* (2006.01)
*H01L 29/08* (2006.01)
*H01L 29/78* (2006.01)

(52) U.S. Cl.
CPC ...... *G11C 13/0097* (2013.01); *H01L 27/2463* (2013.01); *G11C 13/0011* (2013.01); *G11C 2013/005* (2013.01); *G11C 2013/009* (2013.01); *G11C 2213/56* (2013.01); *G11C 2213/79* (2013.01); *H01L 29/0847* (2013.01); *H01L 29/7851* (2013.01); *H01L 45/08* (2013.01); *H01L 45/1233* (2013.01)

(56) References Cited

U.S. PATENT DOCUMENTS

| | | |
|---|---|---|
| 2011/0228594 A1 | 9/2011 | Rao et al. |
| 2013/0148409 A1 | 6/2013 | Chung |
| 2015/0243668 A1 | 8/2015 | Ueda et al. |

OTHER PUBLICATIONS

PCT/US2019/027761 International Search Report and Written Opinion, dated Jul. 17, 2019.

\* cited by examiner

CIRCUIT AND LAYOUT FOR RESISTIVE RANDOM-ACCESS MEMORY ARRAYS HAVING TWO BIT LINES PER COLUMN

BACKGROUND

The present invention relates to integrated circuit technology and to resistive random-access memory (ReRAM) technology. More particularly, the present invention relates to integrated circuit layouts for addressable arrays of ReRAM memory cells employing small geometry transistor devices such as FinFET transistor devices. ReRAM memory cells have been employed as configuration memory for user-programmable integrated circuits by driving a switch transistor that configures a programmable circuit. ReRAM memory cells have also been used as random-access memory (RAM) in integrated circuits. The present invention relates to ReRAM memory cells used in integrated circuits as random-access memory (RAM) cells that have to be addressed and coupled to sense amplifiers to read the data they contain.

Because small geometry transistor devices such as FinFET transistors cannot individually support the voltages necessary for programming and erasing ReRAM devices, two FinFET transistors have been placed in series in addressable ReRAM memory cells.

Figure 1:
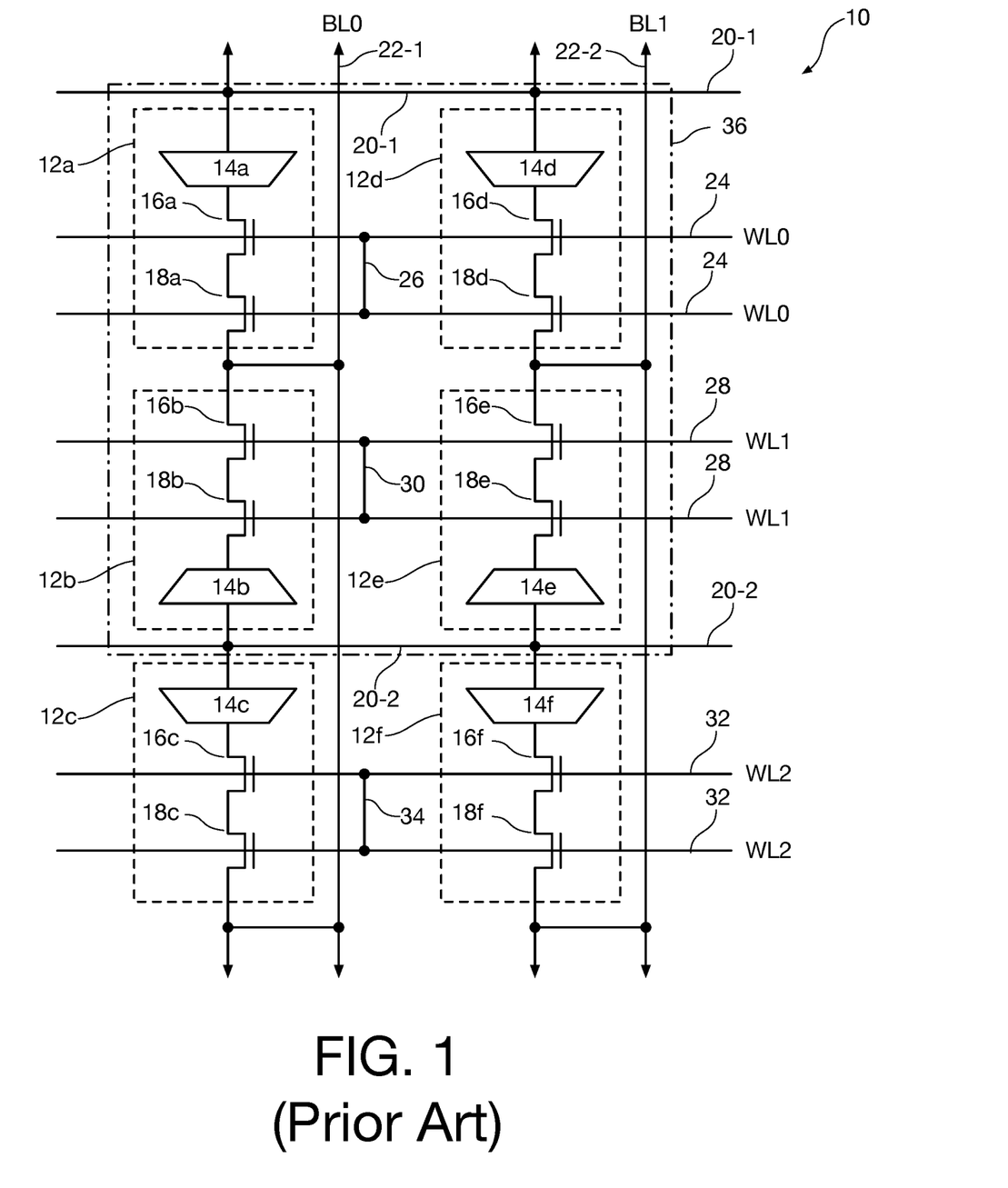
FIG. 1 is a schematic diagram of a portion of a prior-art ReRAM memory array.
Figure 2A:
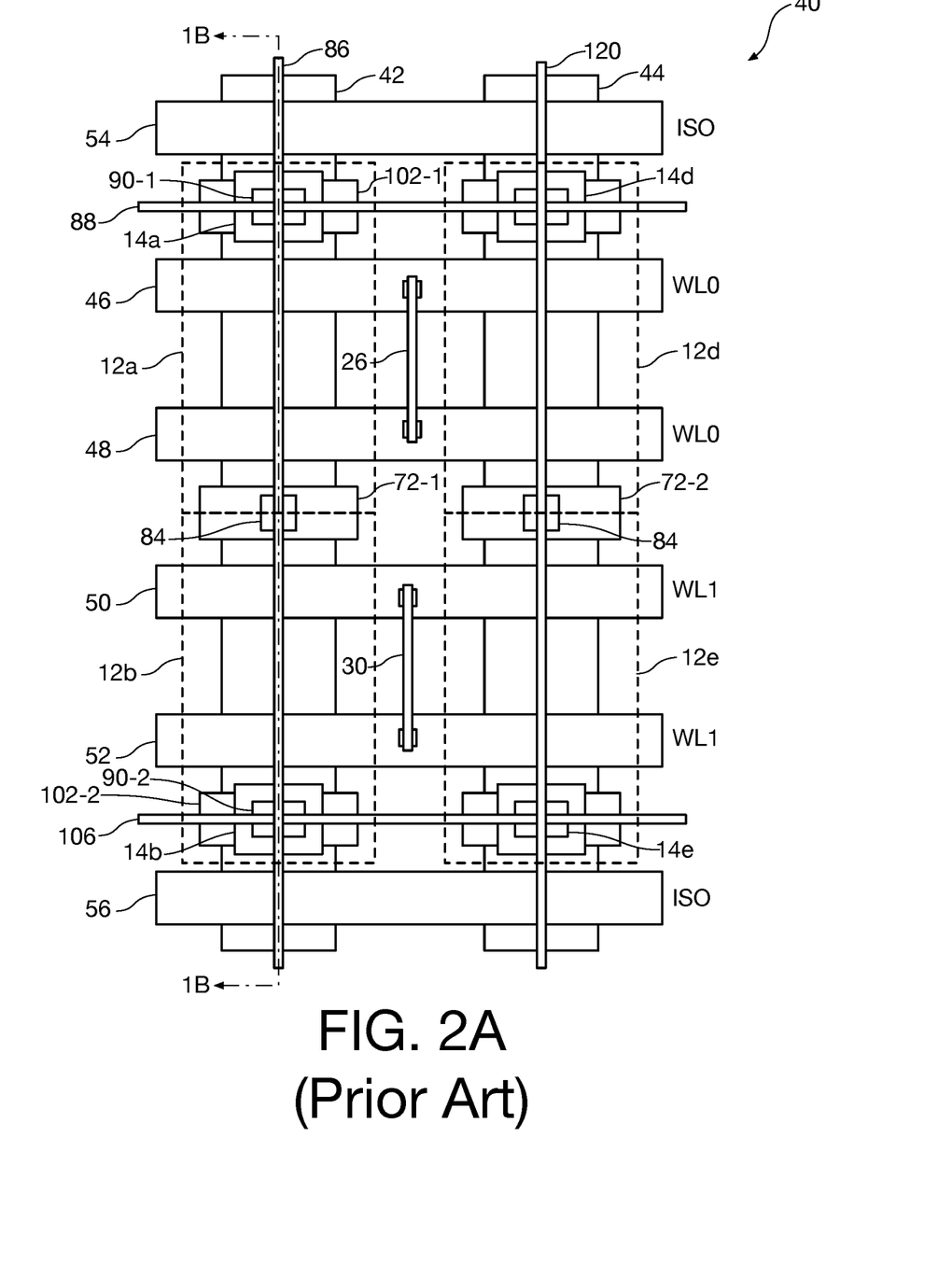
FIG. 2A is a top view of a layout of the portion of the memory array shown in FIG. 1.
Figure 2B:
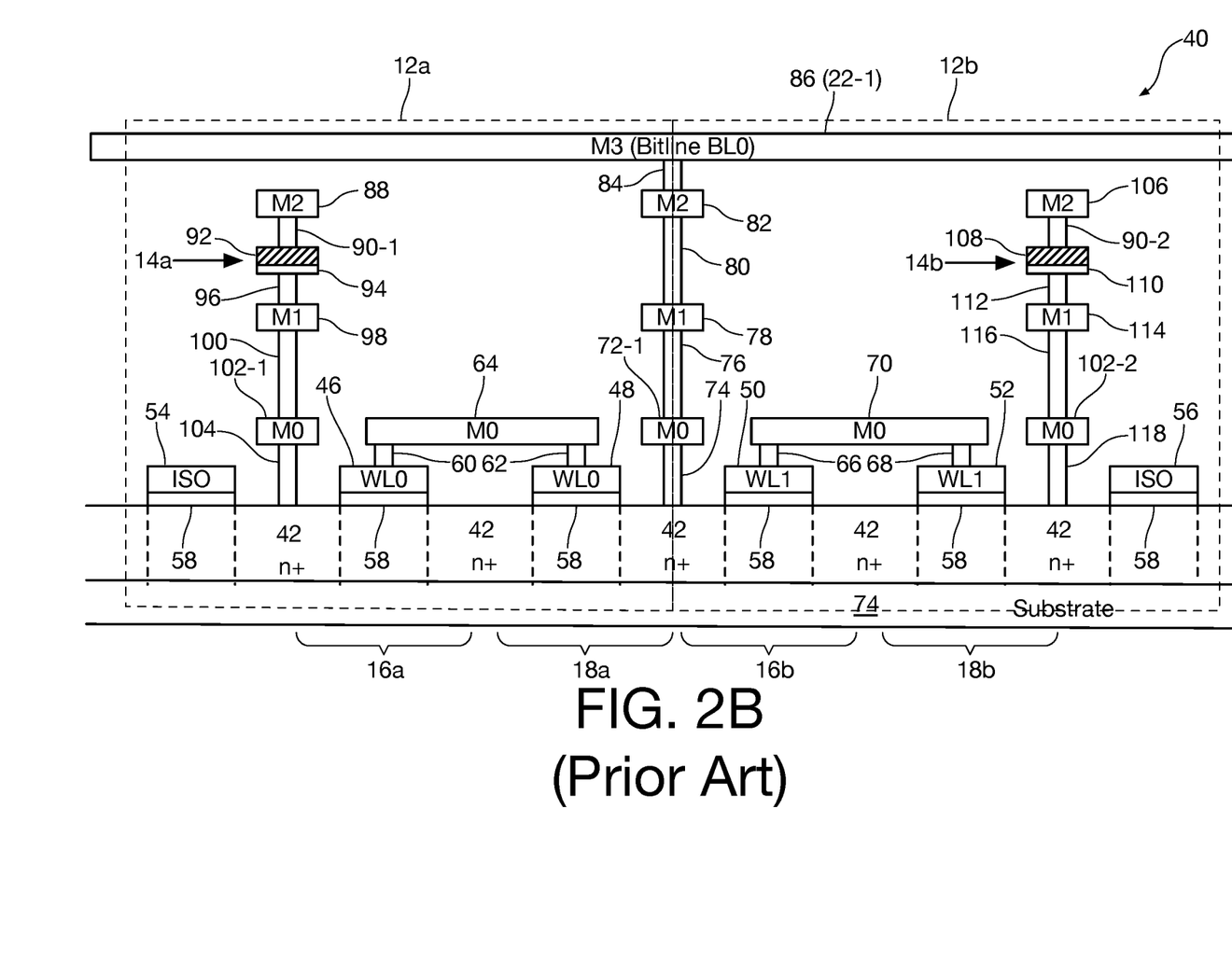
FIG. 2B is a cross-sectional view of the layout of the portion of the memory array shown in FIG. 2A taken through lines 2B-2B.

Referring first of all to FIGS. 1, 2A and 2B, a schematic diagram of a portion 10 of a prior-art ReRAM memory array, a top view of a layout of a portion of the memory array 10 shown in FIG. 1, and a cross-sectional view of the layout of the portion of the memory array shown in FIG. 2A taken through lines 2B-2B are shown, respectively. In FIG. 1, a portion 10 of a prior-art ReRAM memory array includes six ReRAM memory cells (indicated in dashed lines at reference numerals 12a through 12f, respectively). ReRAM memory cells 12a, 12b, and 12c are in a first column of the array and ReRAM memory cells 12d, 12e, and 12f are in a second column of the array. Persons of ordinary skill in the art will observe that the layout of the memory cells 12a through 12f is a mirror configuration. Thus, in the first column of the array memory cells 12a and 12b mirror each other do memory cells 12b and 12c Similar mirroring exists in the second column of the array.

Each memory cell 12a through 12f includes a ReRAM device and two series-connected transistor devices. These circuit elements will be designated using the letter suffixes corresponding to the memory cells in which they are disposed. As an example, ReRAM memory cell 12a includes ReRAM device 14a, and two n-channel FinFET transistor devices 16a and 18a all connected in series between a first common bias node 20-1 and a first bit line BL0 at reference numeral 22-1 associated with a first column of the portion 10 of the array. The convention used in the drawing symbol of the ReRAM devices herein is that the wider end of the ReRAM device is the ion source side of the device and the narrower end is the opposing electrode, which is separated from the ion source by a solid electrolyte layer. To program a ReRAM device, i.e., to set it to a lower resistance, a programming voltage is applied with the most positive potential applied to the wider end of the ReRAM device. To erase a ReRAM device, i.e., to set it to a high resistance, a programming voltage is applied with the most positive potential applied to the narrower end of the ReRAM device.

ReRAM memory cell 12b includes ReRAM device 14b, and two n-channel FinFET transistor devices 16b and 18b all connected in series between a second common bias node 20-2 and the first bit line 22-1. ReRAM memory cell 12c includes ReRAM device 14c, and two n-channel FinFET transistor devices 16c and 18c all connected in series between the second common bias node 20-2 and the first bit line 22-1. The ReRAM cells 12d, 12e, and 12f are similarly connected except that they are connected between the common bias nodes 20-1 and 20-2, respectively, and a second bit line 22-2 associated with a second column of the portion 10 of the array.

The gates of the two FinFET transistors in each row of the array are connected in common to a word line. Thus, the FinFET transistors 16a and 18a and 16d and 18d are connected together to a word line WL0 at reference numeral 24. The word line 24 is shown in two sections, each of which represents a gate line formed from, for example, a metal or metal silicide, that runs the length of the row in the array containing the ReRAM memory cells 12a and 12d. These gate lines are stitched together as represented by connection 26. Similarly, the gates of the FinFET transistors 16b and 18b and 16e and 18e are connected together to the word lines WL1 at reference numeral 28. These gate lines are stitched together as represented by connection 30. The gates of the FinFET transistors 16c and 18c and 16f and 18f are connected together to the word lines WL2 at reference numeral 32. These gate lines are stitched together as represented by connection 34.

Referring now to both FIGS. 2A and 2B, diagrams show a typical layout 40 for an implementation in an integrated circuit of ReRAM memory cells like those of FIG. 1A. The portion of the ReRAM array depicted in FIGS. 2A and 2B is shown within dashed lines 36 of FIG. 1. Accordingly, persons of ordinary skill in the art will note that the layout depicted in FIGS. 2A and 2B do not include the ReRAM cells 12c and 12f depicted in FIG. 1. Where elements of FIG. 1 are depicted in FIGS. 2A and 2B, they will be designated using the same reference numerals used for these elements in FIG. 1.

A first group of fins 42, represented as a diffusion in FIG. 2A for simplicity, forms the source, drains, and channels for the FinFET transistors 16a, 18a, 16b, and 18b of the first column of the array and a second the group of fins 44 forms the source, drains, and channels for the FinFET transistors 16d, 18d, 16e, and 18e in the second column of the array. Dashed lines indicated at reference numerals 12a, 12b, 12d, and 12e in FIG. 2A show the locations of ReRAM memory cells 12a, 12b, 12d, and 12e of FIG. 1.

Gate electrode line 46 forms the gates for FinFET transistors 16a and 16d, and serves as word line WL0. Gate line 48 forms the gates for FinFET transistors 18a and 18d and also serves as word line WL0 (as shown in FIG. 1 and FIG. 2A by connection 26). Gate electrode line 50 forms the gates for FinFET transistors 16b and 16e and serves as word line WL1. Gate electrode line 52 forms the gates for FinFET transistors 18b and 18e and also serves as word line WL1 (as shown in FIG. 1 and FIG. 2A by connection 30). Gate electrode lines 46, 48, 50, and 52 are formed from metal as is known in the FinFET fabrication art.

FinFET technology requires a dummy gate electrode to terminate the ends of a diffusion region to isolate it from adjoining diffusion regions. The dummy gate electrodes are formed at the same time as and in the same manner as the gate electrode lines 46, 48, 50, and 52, and are referred to as dummy gate electrodes because no transistors are formed under them. Dummy gate electrode line 54 provides isolation between ReRAM devices 14a, 14d and ReRAM devices (not shown) that are disposed above dummy gate electrode line 54. Similarly, dummy gate electrode line 56 provides isolation between ReRAM devices 14b, 14e and ReRAM devices (not shown) that are disposed below gate electrode line 56.

Reference numerals 58 in FIG. 2B indicate the gate dielectric layers below the gate electrode lines 46, 48, 50, 54, and 56. Contacts 60 and 62 connect the gate electrode lines 46 and 48 to a metal level 0 (M0) segment 64 (identified as stitch connection 26 in FIG. 1) that connects the gates of FinFETs 16a and 18a together. Contacts 66 and 68 connect the gate lines 50 and 52 to a M0 segment 70 (identified as stitch connection 30 in FIG. 1) that connects the gates of FinFETs 16b and 18b together.

Metal level 0 (M0) segment 72-1 is connected to the group of fins 42 by contact 74 shown in FIG. 2B. Contact 76 connects M0 segment 72-1 to a metal level 1 (M1) segment 78. Contact 80 connects M1 segment 78 to a metal level 2 (M2) segment 82. Contact 84, shown in both FIGS. 2A and 2B connects M2 segment 82 to a metal level 3 (M3) segment 86 that serves as the bit line 22-1 in FIG. 1. Metal segments 78 and 82 and contacts 76 and 80 are not shown in FIG. 2A to avoid overcomplicating the drawing.

Metal layer 2 segment 88 serves as the first common bias node 20-1 in FIG. 1. A contact 90-1 connects the M2 segment 88 to the ReRAM 14a of FIG. 1, shown in FIG. 2A and also shown in FIG. 2B as including an ion source layer 92 and solid electrolyte layer 94. Persons skilled in the art will appreciate that the ReRAM devices are known and are more complicated that as shown in FIG. 2B. As shown in FIG. 2B, the ReRAM device 14a is connected to FinFET transistor 16a through contact 96 to M1 layer segment 98, contact 100 to M0 segment 102-1, and contact 104.

Metal layer 2 segment 106 serves as the second common bias node 20-2 in FIG. 1. a contact 90-2 connects the M2 segment 106 to the ReRAM 14b of FIG. 1, shown in FIG. 2A and also shown in FIG. 2B as including an ion source layer 108 and solid electrolyte layer 110. Persons skilled in the art will appreciate that the ReRAM devices are known and are more complicated that as shown in FIG. 2B. As shown in FIG. 2B, the ReRAM device 14b is connected to FinFET transistor 16b through contact 112 to M1 layer segment 114, contact 116 to M0 segment 102-2, and contact 118.

To program ReRAM device 14a in memory cell 12a in FIG. 1, a positive voltage is applied to word line WL0 24 to turn on transistors 16a and 18a and a voltage is applied between bias line 20-1 and bit line 0 22-1 with the more positive potential applied to bias line 20-1. To erase ReRAM device 14a in memory cell 12a in FIG. 1, a positive voltage is applied to word line WL0 24 to turn on transistors 16a and 18a and a voltage is applied between bias line 20-1 and bit line 0 22-1 with the more positive potential applied to bit line 0 22-1. To inhibit programming/erasing of ReRAM devices 14b and 14c in memory cells 12b and 12c, word lines WL1 28 and WL2 32 are turned off. To inhibit programming/erasing of ReRAM devices 14d, 14e, and 14f in memory cells 12d, 12e, and 12f the voltage at bit line 1 22-2 is set to the same voltage as bias line 0 20-1.

Under the biasing conditions that are present for programming a ReRAM memory cell (using memory cell 12a as an example), the transistors 16a and 18a are in common source configuration which provides current limiting. In addition, since both transistors 16a and 18a are turned on, the voltage across them is close to zero resulting in little or no stress on these transistors. In the reverse direction for erasing a ReRAM device (using memory cell 12a as an example), there is no current limiting because neither of the FinFET transistors of the selected ReRAM cell is connected to ground (i.e., in common source configuration) and the changing resistance of the ReRAM device 14a places a source bias on the transistors 16a and 18a, reducing their current handling capabilities. In addition, a higher voltage is present across the transistors 16a and 18a than during programming, requiring a larger number of FinFET transistors to support the voltage. This requirement places a limit on the minimization of ReRAM memory cells.

In addition, ReRAM memory cells require programming and erase currents of about 100 µA or more. In order to provide such current, the programming and erase paths must have an impedance low enough to allow programming and erase currents of this magnitude to flow. As device sizes decrease, the transistors used become smaller and weaker and wider metal lines are needed to supply the necessary programming potentials. In addition, as noted above with respect to FIG. 2A, prior-art ReRAM memory arrays employing ReRAM memory cells fabricated using deep submicron lines (i.e., FinFET transistor devices) require quantized layout rules that employ the additional dummy gate lines (e.g., dummy gate lines 54 and 56 in FIG. 2A) to terminate diffusion regions between cells.

BRIEF DESCRIPTION

According to one aspect of the present invention, a layout is presented for a ReRAM memory array including rows and columns of ReRAM cells, each ReRAM cell is in a row and column of ReRAM cells. Each ReRAM cell includes a ReRAM device. A first transistor is coupled between the ReRAM device and a first bit line associated with the column containing the ReRAM cell. The first transistor has a gate coupled to a first word line associated with the row containing the ReRAM cell. A second transistor is coupled between the ReRAM device and a second bit line associated with the column containing the ReRAM cell. The second transistor has a gate coupled to a second word line associated with the row containing the ReRAM cell.

BRIEF DESCRIPTION OF THE DRAWING FIGURES

The invention will be explained in more detail in the following with reference to embodiments and to the drawing in which are shown.

DETAILED DESCRIPTION

Persons of ordinary skill in the art will realize that the following description of the present invention is illustrative only and not in any way limiting. Other embodiments of the invention will readily suggest themselves to such skilled persons.

Figure 3:
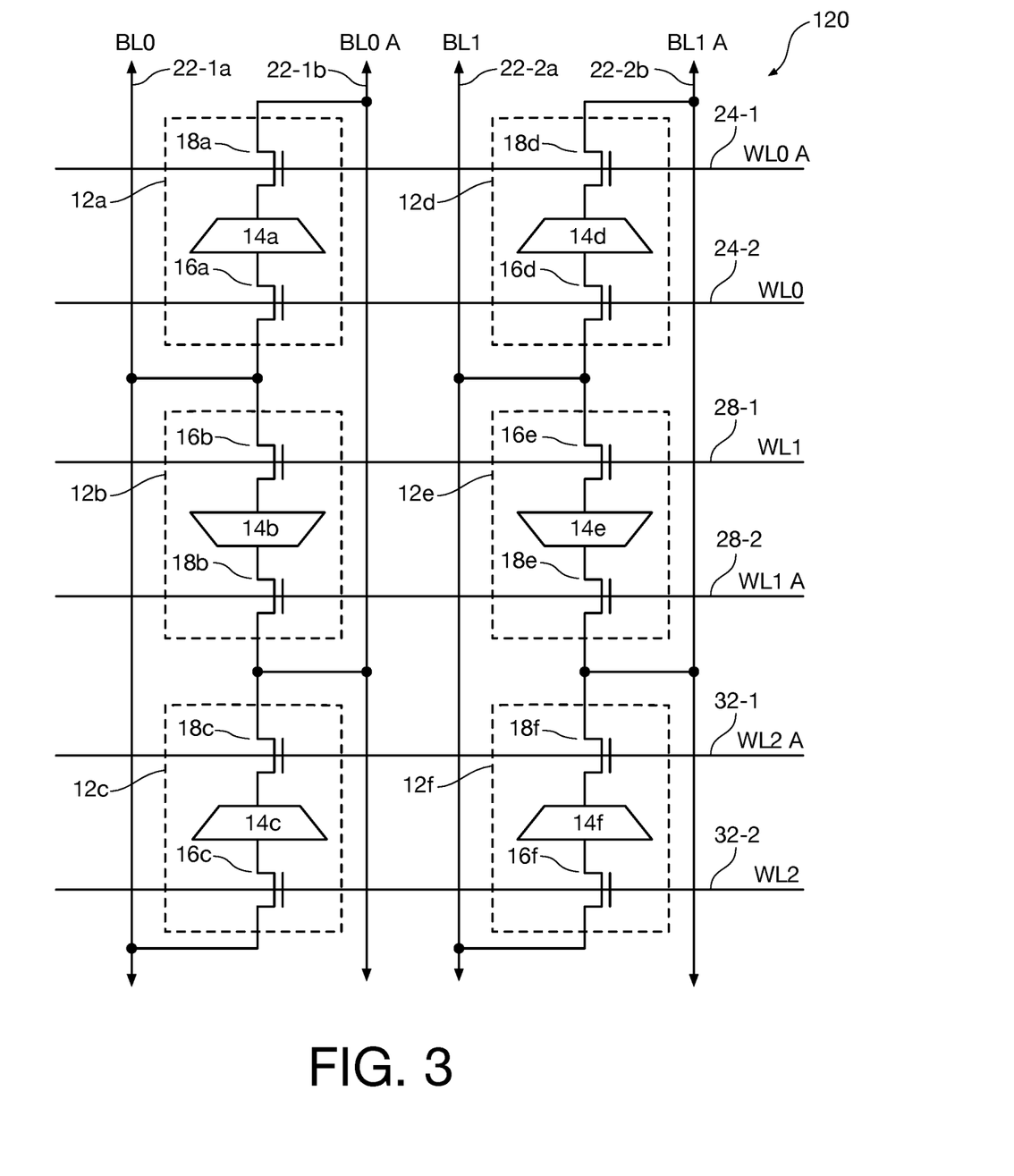
FIG. 3 is a schematic diagram of a portion of a ReRAM memory array in accordance with one aspect of the present invention.

Referring now to FIG. 3 a schematic diagram shows a portion 120 of an addressable ReRAM memory array in accordance with one aspect of the present invention. Various circuit elements in the embodiment of FIG. 3 correspond to circuit elements in the prior-art array of FIG. 1 and will be referred to using the same reference numerals used to identify those circuit elements in FIG. 1.

In FIG. 3, the portion 120 of an addressable ReRAM memory array in accordance with this illustrative embodiment of the invention includes six ReRAM memory cells (indicated in dashed lines at reference numerals 12a through 12f, respectively). ReRAM memory cells 12a, 12b, and 12c are in a first column of the array and ReRAM memory cells 12d, 12e, and 12f are in a second column of the array.

Each memory cell 12a through 12f includes a ReRAM device and two transistor devices connected in series with, but on opposing ends of, the respective ReRAM device. These circuit elements will be designated using the letter suffixes corresponding to the memory cells in which they are disposed. As an example, ReRAM memory cell 12a includes ReRAM device 14a, and two n-channel FinFET transistor devices 16a and 18a. Unlike the transistors 16a and 18a in FIG. 1, the FinFET transistor 16a is connected between the ion source of ReRAM device 14a and a first bit line (BL0) reference numeral 22-1a associated with a first column of the portion 120 of the array and FinFET transistor 18a is connected between the opposing electrode of the ReRAM device 14a and second complementary bit line (BL0 A) reference numeral 22-1b associated with the first column of the portion 120 of the array.

ReRAM memory cell 12b includes ReRAM device 14b, and two n-channel FinFET transistor devices 16b and 18b. The FinFET transistor 16b is connected between the ion source of the ReRAM device 14b and the first bit line (BL0) 22-1a of the array and FinFET transistor 18b is connected between the opposing electrode of the ReRAM device 14b and the second complementary bit line (BL0 A) 22-1b associated with the first column of the portion 120 of the array.

ReRAM memory cell 12c includes ReRAM device 14c, and two n-channel FinFET transistor devices 16c and 18b. The FinFET transistor 16c is connected between the ion source of the ReRAM device 14c and the first bit line (BL0) 22-1a of the array and FinFET transistor 18c is connected between the opposing electrode of the ReRAM device 14c and the second complementary bit line (BL0 A) 22-1b associated with the first column of the portion 120 of the array.

The ReRAM cells 12d, 12e, and 12f are similarly connected except that they are connected between the complementary bit lines (BL1) 22-2a and (BL1 A) 22-2b.

Figure 4A:
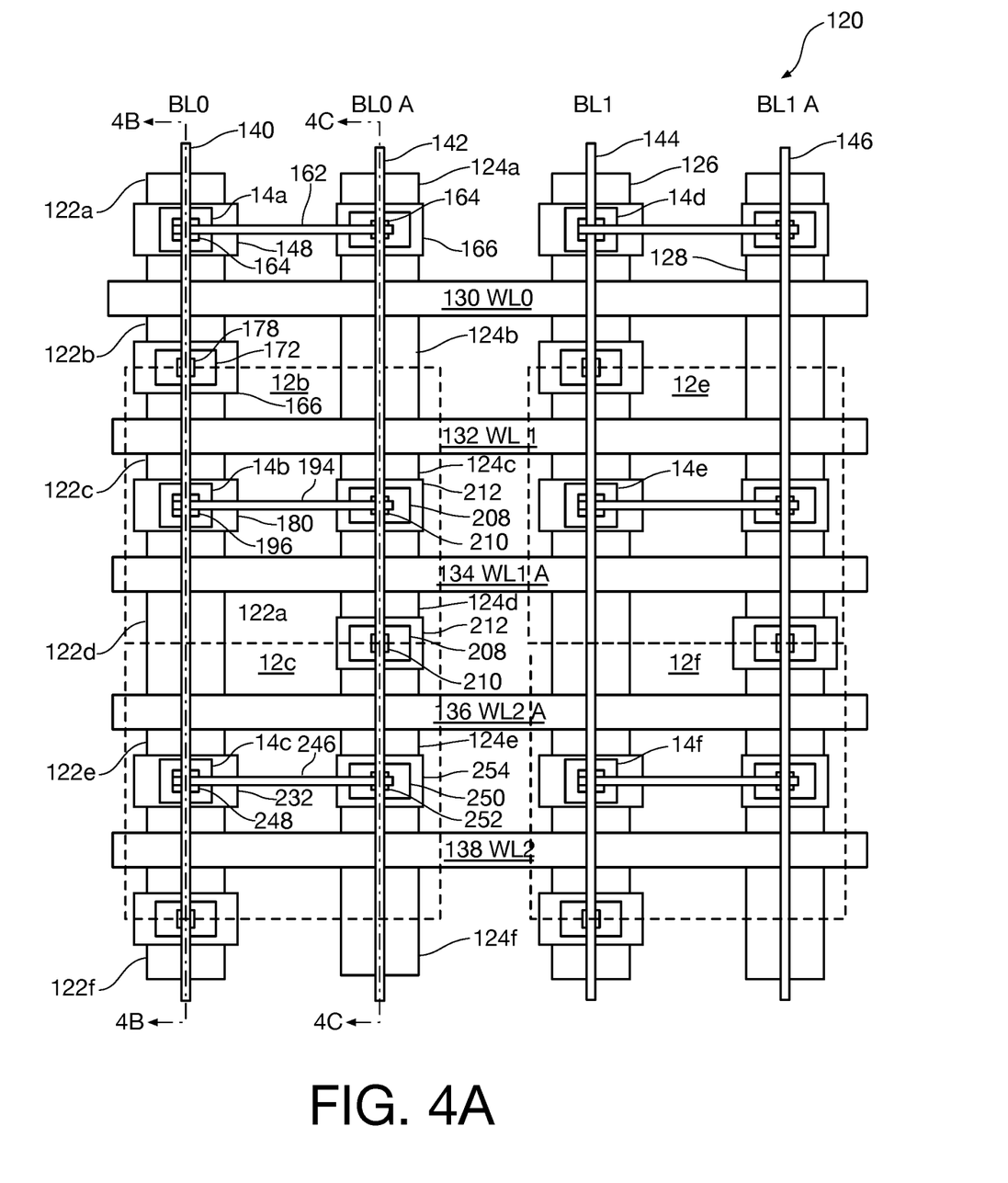
FIG. 4A is a top view of a layout of the portion of the memory array shown in FIG. 3.
Figure 4B:
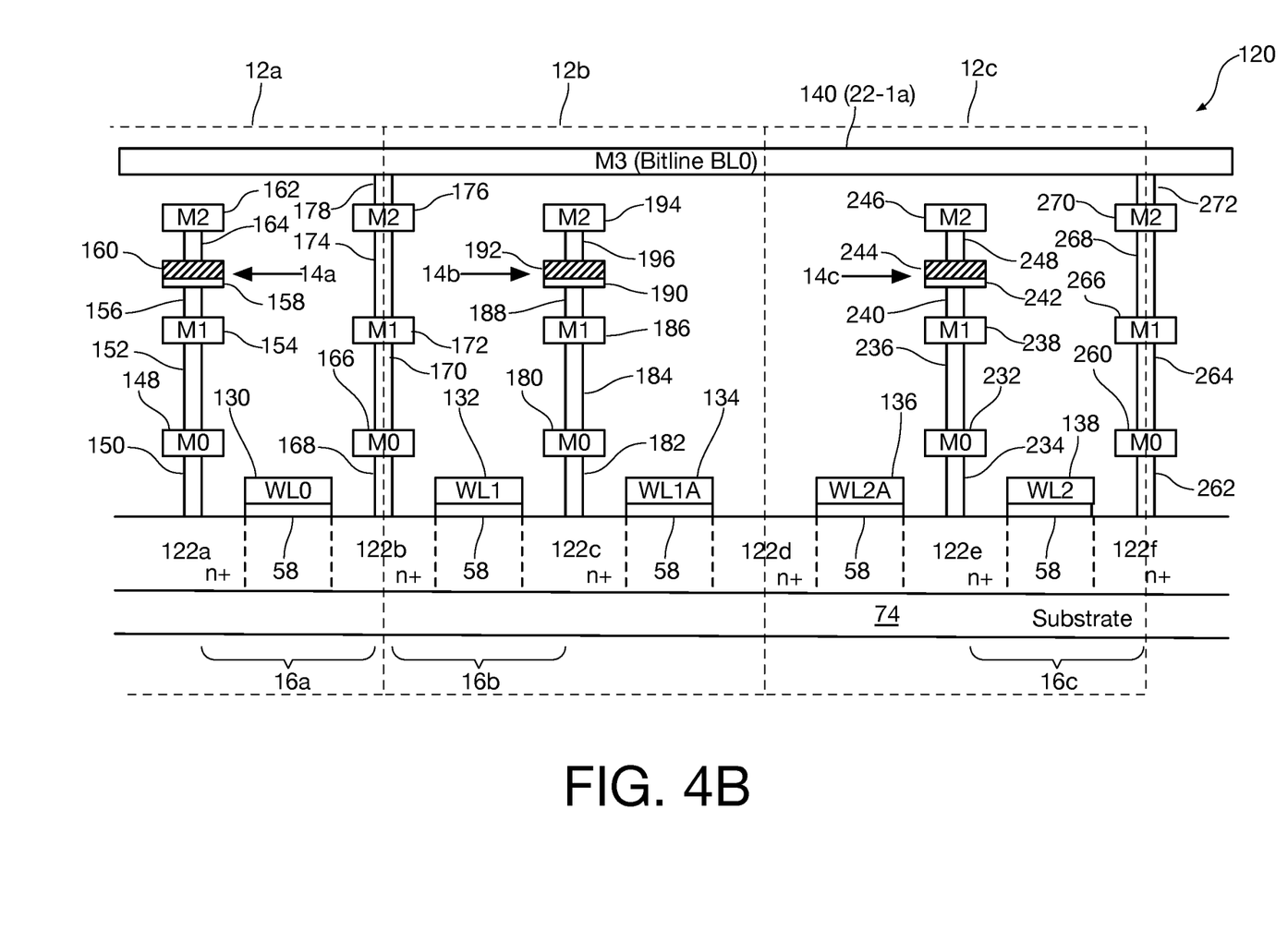
FIG. 4B is a cross-sectional view of the layout of the portion of the memory array shown in FIG. 4A taken through lines 4B-4B.
Figure 4C:
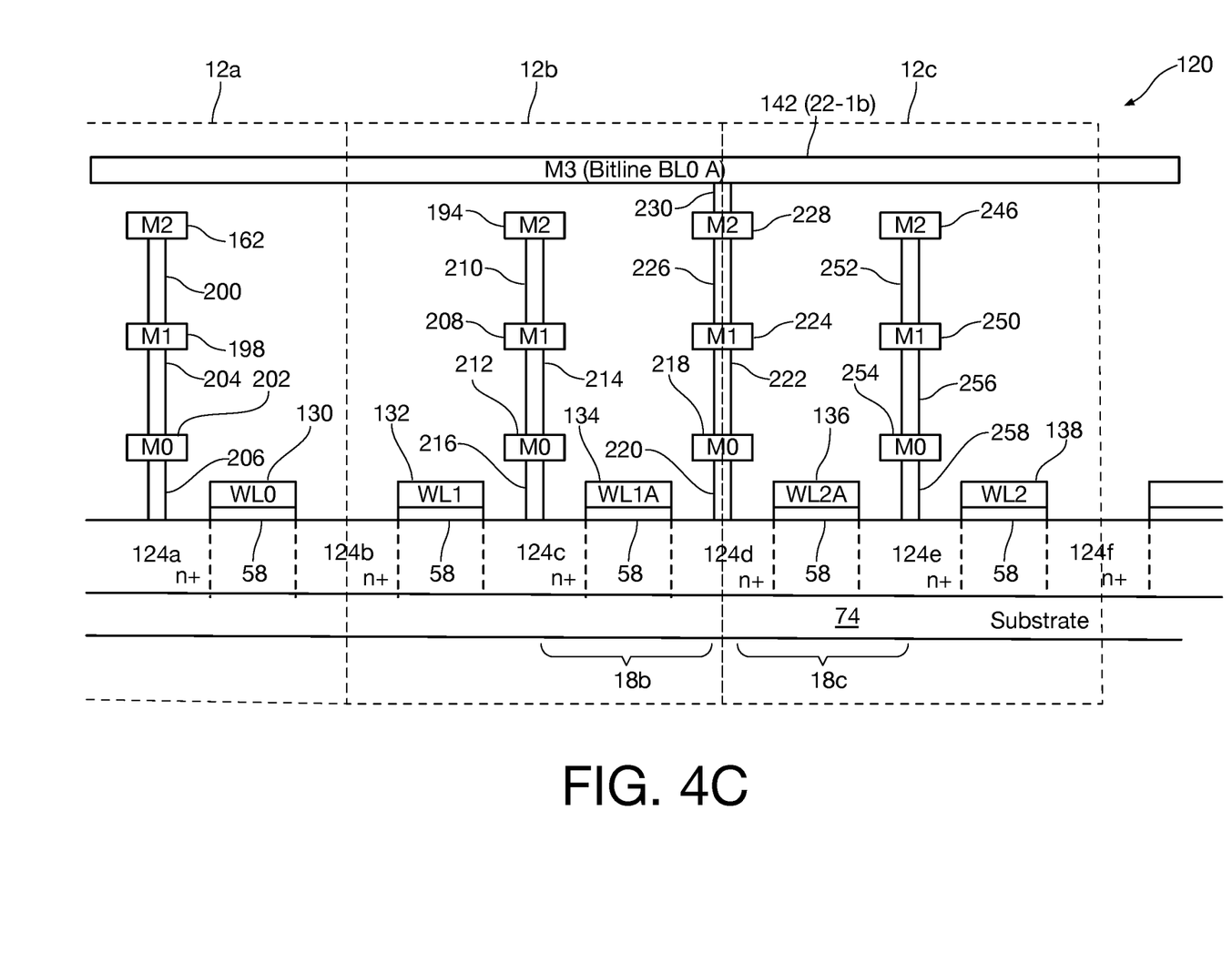
FIG. 4C is a cross-sectional view of the layout of the portion of the memory array shown in FIG. 4A taken through lines 4C-4C.

Persons of ordinary skill in the art will note that the orientations of the ReRAM devices change in alternate rows. This is because the layout shown in FIGS. 4A through 4C is mirrored in alternate rows. As indicated above, the ReRAM devices are programmed by placing the most positive potential on the end of the ReRAM device shown as being wider than the other end.

The gates of the two FinFET transistors 16a and 16d in the first row of the array are connected in common to a word line (WL0) 24-2. The gates of the two FinFET transistors 18a and 18d in the first row of the array are connected in common to a word line (WL0 A) 24-1. The gates of the two FinFET transistors 16b and 16e in the second row of the array are connected in common to a word line (WL1) 28-1. The gates of the two FinFET transistors 18b and 18e in the second row of the array are connected in common to a word line (WL1 A) 28-2. The gates of the two FinFET transistors 18c and 18f in the third row of the array are connected in common to a word line (WL2) 32-1. The gates of the two FinFET transistors 16c and 16f in the third row of the array are connected in common to a word line (WL2 A) 32-1.

Referring now to FIG. 4A, FIG. 4B, and FIG. 4C, top and cross-sectional views show an illustrative layout of the portion 120 of the memory array shown in FIG. 3 including two columns of ReRAM memory cells. FIG. 4B is a cross-sectional view of the layout of the portion of the memory array shown in FIG. 4A taken through lines 4B-4B. FIG. 4C is a cross-sectional view of the layout of the portion of the memory array shown in FIG. 4A taken through lines 4C-4C. Some of the circuit elements in the embodiment of FIG. 4A, FIG. 4B, and FIG. 4C correspond to circuit elements in the prior-art array of FIGS. 2A and 2B and will be referred to using the same reference numerals used to identify those circuit elements in FIGS. 2A and 2B.

FIG. 4A, FIG. 4B, and FIG. 4C show in dashed lines complete ReRAM memory cells 12b and 12e in the second row of the array and complete ReRAM memory cells 12c and 12f in the third row of the array. The portion of the layout of FIG. 4A above ReRAM memory cells 12b and 12e are incomplete sections of ReRAM memory cells 12a and 12d.

As shown in FIG. 4A, the ReRAM devices 14a, 14b, and 14c in the first column of the array are connected to a first group of fins (divided into regions 122a through 122f). The first group of fins divided into regions 122a through 122f also forms the source, drains, and channels for the FinFET transistors 16a, 16b, and 16c of the first column of the array and a second group of fins 124 (divided into regions 124a through 124f) forms the source, drains, and channels for the FinFET transistors 18a, 18b, and 18c of the first column of the array.

The ReRAM devices 14d, 14e, and 14f in the second column of the array are connected to a third group of fins 126. The third group of fins 126 also forms the source, drains, and channels for the FinFET transistors 16d, 16e, and 16f of the second column of the array and a fourth group of fins 128 forms the source, drains, and channels for the FinFET transistors 18d, 18e, and 18f of the second column of the array. The first group of fins divided into regions 122a through 122f is shown in FIG. 4B and the second group of fins divided into regions 124a through 124f is shown in FIG. 4C.

Gate electrode line 130 is word line WL0 (reference numeral 24-2 in FIG. 3) and forms the gates for FinFET transistors 16a and 16d in ReRAM memory cells 12a and 12d (only a portion of which are shown in FIGS. 4A and 4B). Gate electrode line 132 is word line WL1 (reference numeral 28-1 in FIG. 3) and forms the gates for FinFET transistors 16b and 16e in ReRAM memory cells 12b and 12e. Gate electrode line 134 is word line WL1 A (reference numeral 28-2 in FIG. 3) and forms the gates for FinFET transistors 18b and 18e in ReRAM memory cells 12b and 12e. Gate electrode line 136 is word line WL2A (32-1 in FIG. 3) and forms the gates for FinFET transistors 18c and 18f in ReRAM memory cells 12c and 12f. Gate electrode line 138 is word line WL2 (reference numeral 32-2 in FIG. 3) and forms the gates for FinFET transistors 16c and 16f in ReRAM memory cells 12c and 12f. Reference numerals 58 shown in FIG. 4B indicate the gate dielectric layers that separate group of fins 122 from the gate electrode lines 130, 132, 134, 136, and 138.

As seen in FIG. 4A and FIG. 4B, in the first column of the array, a metal level 3 (M3) line 140 forms bit line BL0 (reference numeral 22-1a in FIG. 3) and as seen in FIG. 4A and FIG. 4C a metal level 3 (M3) line 142 forms bit line BL0 A (22-1b in FIG. 3). In the second column of the array (seen only in FIG. 4A), a metal level 3 (M3) line 144 forms bit line BL1 (22-2a in FIG. 3) and a metal level 3 (M3) line 146 forms bit line BL1 A (22-2b in FIG. 3).

The embodiment shown in FIG. 4A, FIG. 4B, and FIG. 4C includes some structures that are similar to structures in the prior-art layout depicted in FIG. 2A and FIG. 2B. These structures include contact and metal segment structures that connect transistor diffusions to bit lines as well as the layers that form the ReRAM devices and the contact and metal line structures that connect the ReRAM devices to the remainder of the circuitry in the layout. These structures are in different positions in the embodiment shown in FIG. 3, FIG. 4A and FIG. 4B than they were in the prior-art layout of FIG. 2A and FIG. 2B.

As seen in FIGS. 4A and 4B, in the partial view of ReRAM memory cell 12a, a metal level 0 (M0) segment 148 is connected to the portion of the group of fins 122a that forms the drain of FinFET transistor 16a by a contact 150 shown in FIG. 4B. Contact 152 connects M0 segment 148 to a metal level 1 (M1) segment 154. Contact 156 connects M1 segment 154 to the solid electrolyte layer 158 of the ReRAM device 14a. The ion source layer 160 of the ReRAM device 14a is connected to a metal level 2 (M2) segment 162 through a contact 164. As will be more easily seen with reference to FIG. 4C, the metal level 2 (M2) segment 162 connects the ion source layer 160 of the ReRAM device 14a to fin region 124a in the second group of fins as shown in FIG. 4C. Fin region 124a forms the source of transistor 18a. As will be appreciated by persons of ordinary skill in the art, the remainder of transistor 18a is located beyond the left edge of FIG. 4C.

As shown in FIG. 4B, a metal level 0 (M0) segment 166 is connected to the portion of the group of fins 122b that forms the source of both FinFET transistors 16a and 16b by a contact 168. Contact 170, shown in both FIGS. 4A and 4B connects M0 segment 166 to a metal level 1 (M1) metal segment 172. A contact 174 connects metal level 1 (M1) metal segment 172 to a metal level 3 (M2) segment 176. A contact 178 connects metal level 2 (M2) metal segment 176 to the metal level 3 (M3) segment 140 that serves as the bit line BL0 22-1a in FIG. 3.

As seen in FIGS. 4A and 4B, in the ReRAM memory cell 12b, a metal level 0 (M0) segment 180 is connected to the portion of the group of fins 122c that forms the drain of FinFET transistor 16b by a contact 182 shown in FIG. 4B. Contact 184 connects M0 segment 180 to a metal level 1 (M1) segment 186. Contact 188 connects M1 segment 186 to the solid electrolyte layer 190 of the ReRAM device 14a. The ion source layer 192 of the ReRAM device 14a is connected to a metal level 2 (M2) segment 194 through a contact 192. As will be more easily seen with reference to FIG. 4C, the metal level 2 (M2) segment 194 connects the ion source layer 192 of the ReRAM device 14b to the source of transistor 18b at fin region 124c in the second group of fins.

As seen in FIG. 4C, metal level 2 (M2) segment 162 is connected to metal level 1 (M1) segment 198 through contact 200. Metal level 1 (M1) segment 198 is connected to metal level 0 (M0) segment 202 through contact 204. Metal level 0 (M0) segment 202 is connected to the portion of the group of fins 124a that forms the drain of FinFET transistor 18a through contact 206. Metal level 2 (M2) segment 194 is connected to metal level 1 (M1) segment 208 through contact 210. Metal level 1 (M1) segment 208 is connected to metal level 0 (M0) segment 212 through contact 214. Metal level 0 (M0) segment 212 is connected to the portion of the group of fins 124c that forms the drain of FinFET transistor 18b through contact 216.

As also seen in FIG. 4C, a metal level 0 (M0) segment 218 is connected to the portion of the group of fins 124d that forms the sources of both FinFET transistors 18b and 18c by a contact 220. Contact 222, shown in both FIGS. 4A and 4C connects M0 segment 218 to a metal level 1 (M1) metal segment 224. A contact 226 connects metal level 1 (M1) metal segment 224 to a metal level 3 (M2) segment 228. A contact 230 connects metal level 2 (M2) metal segment 228 to the metal level 3 (M3) segment 142 that serves as the bit line BL0 22-1b in FIG. 3.

Referring again to FIG. 4A and FIG. 4B, in the ReRAM memory cell 12c, a metal level 0 (M0) segment 232 is connected to the portion of the group of fins 122e that forms the drain of FinFET transistor 16c by a contact 234 shown in FIG. 4B. Contact 236 connects M0 segment 234 to a metal level 1 (M1) segment 238. Contact 240 connects M1 segment 238 to the solid electrolyte layer 242 of the ReRAM device 14c. The ion source layer 244 of the ReRAM device 14c is connected to a metal level 2 (M2) segment 246 through a contact 248. As will be more easily seen with reference to FIG. 4C, the metal level 2 (M2) segment 246 connects the ion source layer 244 of the ReRAM device 14c to the source of transistor 18c at fin region 124e.

As seen in FIG. 4A and FIG. 4C, the other end of metal level 2 (M2) segment 246 is connected to metal level 1 (M1) segment 250 through contact 252. Metal level 1 (M1) segment 250 is connected to a metal level 0 (M0) segment 254 through contact 256. Metal level 0 (M0) segment 254 is connected to the portion of the group of fins 124e that forms the drain of FinFET transistor 18c through contact 258.

Referring again to FIG. 4A and FIG. 4B, in the ReRAM memory cell 12c, a metal level 0 (M0) segment 260 is connected to the portion of the group of fins 122f that forms the drain of FinFET transistor 16c by a contact 262 shown in FIG. 4B. Contact 264 connects M0 segment 260 to a metal level 1 (M1) segment 266. Contact 268 connects M1 segment 266 to a metal level 2 (M2) segment 270. A contact 272 connects metal level 2 (M2) metal segment 270 to the metal level 3 (M3) segment 140 that serves as the bit line BL0 22-1a in FIG. 3.

The ReRAM memory cells 14d, 14e, and 14f that are formed on the group of fins 126 and 128 and connected to bit lines 144 and 146 are connected in exactly the same way as was just described for the ReRAM memory cells 14a, 14b, and 14c.

TABLE 1 shows the operating voltages that are applied to the various connections from the ReRAM cell to program, erase, and read ReRAM device 14b in ReRAM memory cell 12b of FIG. 3. The other ReRAM memory cells in FIG. 3 are shown in TABLE 1 as being unselected. In read mode, according to one read procedure bit line BL0A is precharged to a voltage such as 0.2V and current $I_{sense}$ flowing in bit line BL0A is detected. If a current having a magnitude larger than a predetermined threshold flows, the cell is in a programmed state and if a current having a magnitude lower than the predetermined threshold flows the cell is in an erased state. Persons of ordinary skill in the art will appreciate that other read schemes can be employed.

TABLE 1

|      | PGM   | ERASE | READ  |
|------|-------|-------|-------|
| BL0  | 2.4 V | 0 V   | 0.5 V |
| BL0A | 0 V   | 2.4 V | Sense |
| BL1  | 0 V   | 0 V   | 0 V   |
| BL1A | 0 V   | 0 V   | 0 V   |
| WL0  | 0 V   | 0 V   | 0 V   |
| WL0A | 0 V   | 0 V   | 0 V   |
| WL1  | 2.7 V | 1.6 V | 1.5 V |
| WL1A | 1.6 V | 2.7 V | 1.5 V |
| WL2  | 0 V   | 0 V   | 0 V   |
| WL2A | 0 V   | 0 V   | 0 V   |

Persons of ordinary skill in the art will observe that more than one ReRAM memory cell in a row of the array of FIG. 3 can be programmed, erased, or read simultaneously. For example, ReRAM device 14h in ReRAM memory cell 12h can be programmed at the same time as ReRAM device 14b in ReRAM memory cell 12b if bit line BL1 22-2a and bit line BL1A 22-2b are biased the same as bit line BL1 22-1a and bit line BL1A 22-1b, respectively.

An advantage of the ReRAM cells and arrays of the present invention is that it eliminates the need for dummy gate electrodes as in the prior-art ReRAM memory cells employing FinFET transistor devices. Another advantage that can be observed from FIG. 3 and Table 1, is that regardless of whether a ReRAM cell is being programmed or erased, one of the n-channel FinFET transistor devices 16 or 18 is connected as a common source device. This provides the advantage that the common source transistor can limit the current being supplied through the ReRAM device by either the capacitance of the bit line or from the power supply through the bit line and that the programming and erasing circuit paths are symmetrical. Thus, programming and erasing are both well controlled. This advantage comes at the cost of requiring two groups of fins for each column of the array, but providing two groups of fins reduces the overall bit line resistance, allowing more current to be passed for given bit line widths.

Figure 5:
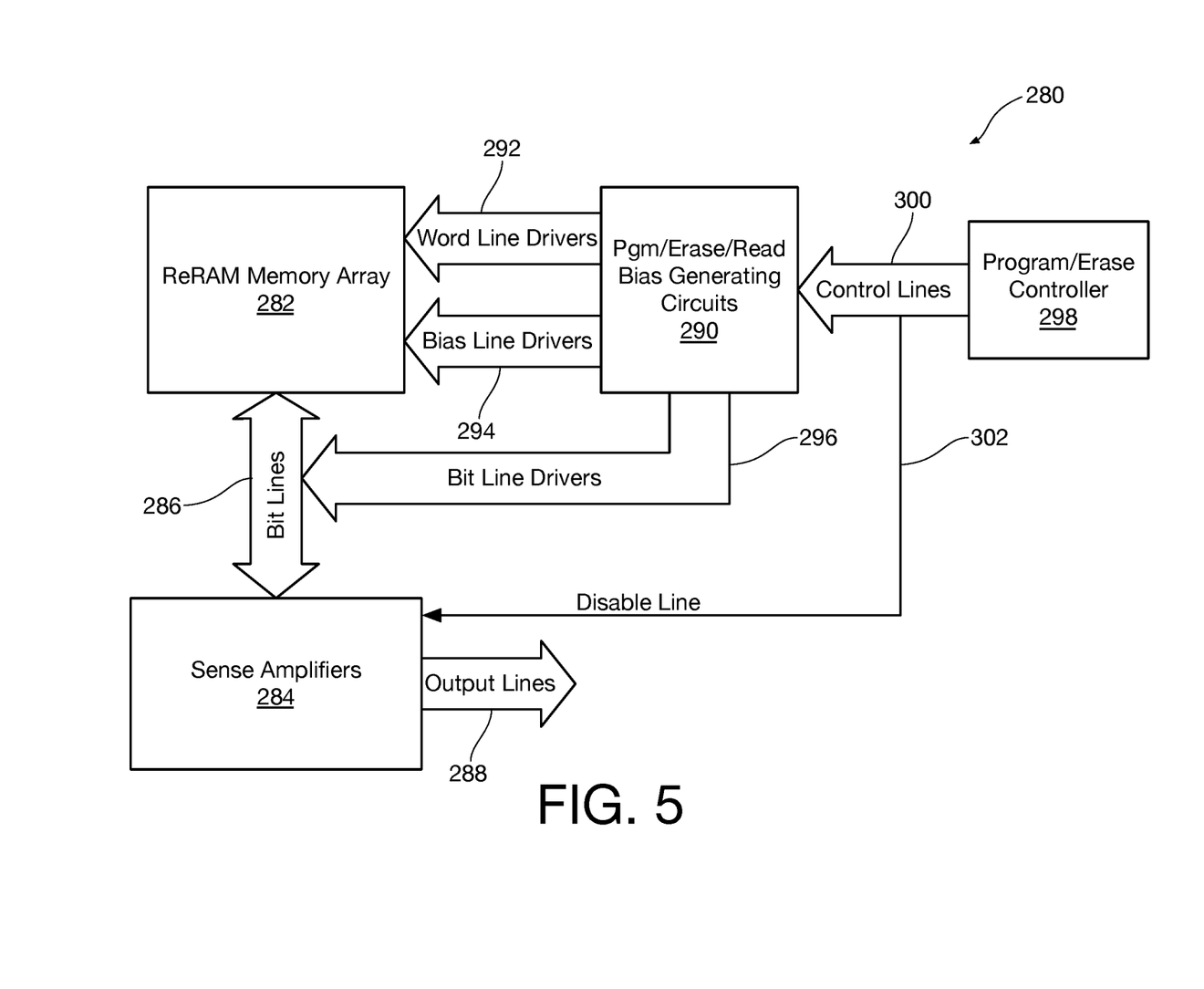
FIG. 5 is a block diagram showing a typical ReRAM memory array and associated read, write, and erase control circuits in accordance with an aspect of the present invention.

Referring now to FIG. 5, a block diagram shows a typical ReRAM memory array system and associated read, write, and erase control circuits in accordance with an aspect of the present invention. The ReRAM memory array system 280 includes a ReRAM memory array 282, driving sense amplifier circuits 284 via bit lines 286. The sense amplifier circuits may be any type of sense amplifier circuits depending on the output voltages/currents present on the bit lines 286 during the read mode operation of the ReRAM memory array 282. Design of particular sense amplifier circuits is well within the scope of ordinary skill in the art. Output of the sense amplifiers is presented on output lines 288.

Reading, programming (writing) and erasing the memory cells in the ReRAM memory array 282 is controlled by the program/erase/read bias generating circuits 290. The program/erase/read bias generating circuits 290 generate the potentials shown in Table 1 to operate the program, erase, and read modes of the ReRAM memory array 282. Design of particular circuits will depend on the particular potentials required and is well within the level of ordinary skill in the art. The potentials necessary to operate the program, erase, and read modes of the ReRAM memory array 282 are driven into the ReRAM memory array 282 to operate the program, erase, and read modes of the ReRAM memory array 282 by word line driver 292, bias line drivers 294 and bit line drivers 296. Word line driver, bias line driver and bit line driver circuits are known in the art and particular instances of these circuits are easily designed for particular ReRAM memory arrays having specific voltage and current requirements.

Program/erase controller 298 directs the operation of program/erase/read bias generating circuits 290 over control lines 300 by providing timing and other control in a manner known in the art. Persons skilled in the art will appreciate that sense amplifiers 284 are disabled during programming and erase operations by asserting a signal from program/erase controller 298 on disable line 302.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A layout for a ReRAM memory array including rows and columns of ReRAM cells, each ReRAM cell in a row and column of ReRAM cells comprising:
   a ReRAM device;
   a first FinFET transistor coupled between the ReRAM device and a first bit line associated with the column containing the ReRAM cell, the first FinFET transistor having a gate coupled to a first word line associated with the row containing the ReRAM cell;
   a second FinFET transistor coupled between the ReRAM device and a second bit line associated with the column containing the ReRAM cell, the second FinFET transistor having a gate coupled to a second word line associated with the row containing the ReRAM cell;
   wherein each column includes a first group of fins and a second group of fins separate from the first group of fins;
   the first FinFET transistor for each memory cell in every column of the array is formed on the first group of fins associated with that column; and
   the second FinFET transistor for each memory cell in every column of the array is formed on the second group of fins associated with that column.

2. The ReRAM memory array of claim 1 further including a sense amplifier for each column of the array, the sense amplifier for each column in the array coupled to one of the first and second bit lines associated with its column in the array.

3. The ReRAM memory array of claim 1 wherein:
   the first transistors in first pairs of adjacent memory cells in each column share a common source/drain diffusion in the first group of fins; and
   the second transistors in second pairs of adjacent memory cells in each column share a common source/drain diffusion in the second group of fins.

4. The ReRAM memory array of claim 3 wherein:
   the common source/drain diffusion in the first group of fins is connected to the first bit line associated with the column containing the ReRAM cell; and
   the common source/drain diffusion in the second group of fins is connected to the second bit line associated with the column containing the ReRAM cell.

5. The ReRAM memory array of claim 1 wherein:
   the ReRAM device in each memory cell in a column of the array is formed over the first group of fins associated with that column.

6. A ReRAM cell comprising:
   a ReRAM device;

a first FinFET transistor coupled between the ReRAM device and a first bit line associated with the ReRAM cell, the first FinFET transistor having a gate coupled to a first word line associated with the ReRAM cell;

a second FinFET transistor coupled between the ReRAM device and a second bit line associated with the ReRAM cell, the second FinFET transistor having a gate coupled to a second word line associated with the ReRAM cells;

the first FinFET transistor is formed on a first group of fins; and the second FinFET transistor is formed on a second group of fins separate from the first group of fins.

* * * * *